(12) United States Patent
Hadano et al.

(10) Patent No.: US 12,170,225 B2
(45) Date of Patent: Dec. 17, 2024

(54) LASER PROCESSING METHOD

(71) Applicant: DISCO CORPORATION, Tokyo (JP)

(72) Inventors: Yuji Hadano, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 83 days.

(21) Appl. No.: 17/448,425

(22) Filed: Sep. 22, 2021

(65) Prior Publication Data

US 2022/0122886 A1  Apr. 21, 2022

(30) Foreign Application Priority Data

Oct. 15, 2020  (JP) ................................ 2020-174049

(51) Int. Cl.
  *H01L 21/268*  (2006.01)
  *H01L 21/56*  (2006.01)
  *H01L 21/78*  (2006.01)

(52) U.S. Cl.
  CPC ............ *H01L 21/78* (2013.01); *H01L 21/268* (2013.01); *H01L 21/56* (2013.01)

(58) Field of Classification Search
  CPC .... H01L 21/78; H01L 21/268; H01L 21/3043
  See application file for complete search history.

(56) References Cited

U.S. PATENT DOCUMENTS

| 6,525,296 | B2* | 2/2003 | Matsushima | ........... | B23K 26/08 |
| | | | | | 219/121.69 |
| 11,090,762 | B2* | 8/2021 | Hadano | ................. | B23K 26/364 |
| 2004/0112880 | A1* | 6/2004 | Sekiya | ................ | H01L 21/6836 |
| | | | | | 257/E21.599 |
| 2004/0121245 | A1* | 6/2004 | Inao | ....................... | G03F 7/7035 |
| | | | | | 430/311 |
| 2004/0137338 | A1* | 7/2004 | Inao | .................... | G03F 7/70566 |
| | | | | | 430/311 |
| 2008/0079926 | A1* | 4/2008 | Ito | ......................... | G03F 7/2014 |
| | | | | | 355/72 |
| 2015/0190079 | A1* | 7/2015 | Yamaji | ............... | A61B 5/14552 |
| | | | | | 29/841 |
| 2019/0122907 | A1* | 4/2019 | Hadano | ................ | B23K 26/032 |
| 2019/0185656 | A1* | 6/2019 | Ogawa | .................... | C08L 33/10 |
| 2019/0232431 | A1* | 8/2019 | Hadano | ................. | B23K 26/53 |
| 2019/0311952 | A1* | 10/2019 | Nishida | ................... | H01L 21/78 |

FOREIGN PATENT DOCUMENTS

JP    2004188475 A    7/2004
JP    2019069465 A    5/2019

OTHER PUBLICATIONS

Office Action issued in counterpart German patent application No. 10 2021 211 093.2, Jun. 21, 2023.

* cited by examiner

*Primary Examiner* — Nicholas J Tobergte
(74) *Attorney, Agent, or Firm* — Greer Burns & Crain Ltd.

(57) ABSTRACT

A laser processing method includes a scattered-light blocking film stacking step of stacking a scattered-light blocking film that blocks scattered light of a laser beam on an upper surface side of a wafer, a holding step of holding a lower surface side of the wafer by a chuck table, a laser processing step of forming a layer of water on the upper surface side of the wafer and irradiating a region to be processed in the wafer with the laser beam while moving the chuck table and a laser beam irradiation unit relatively, and a scattered-light blocking film removal step of removing the scattered-light blocking film from the wafer for which the laser processing step has ended.

12 Claims, 6 Drawing Sheets

LASER PROCESSING METHOD

BACKGROUND OF THE INVENTION

Field of the Invention

The present invention relates to a laser processing method in which a laser processing apparatus is used.

Description of the Related Art

A wafer on which plural devices such as integrated circuits (ICs) and large scale integration (LSI) circuits are formed on a front surface in such a manner as to be marked out by plural planned dividing lines that intersect is divided into individual device chips by a laser processing apparatus, and the device chips obtained by the dividing are used for pieces of electronic equipment such as mobile phones, personal computers, and illuminating equipment.

As a related art, a technique is known in which the front surface of a wafer is coated with a liquid resin before processing is executed through irradiating the wafer held by a holding unit with a laser beam with a wavelength having absorbability with respect to the wafer, and adhesion of a molten object (debris) generated in the irradiation with the laser beam to devices is prevented (for example, refer to Japanese Patent Laid-open No. 2004-188475).

Furthermore, the present applicant has proposed a laser processing apparatus of a type configured to include at least a holding unit that holds a wafer, water layer forming means that forms a layer of water on an upper surface of the wafer held by the holding unit, a laser beam irradiation unit that executes irradiation with a laser beam with a wavelength having absorbability with respect to the wafer to process the wafer, and a processing feed mechanism that executes processing feed of the holding unit and the laser beam irradiation unit relatively (for example, refer to Japanese Patent Laid-open No. 2019-069465).

It has turned out that the technique described in Japanese Patent Laid-open No. 2019-069465 provides the following advantage. Due to immersion of the wafer in water, debris generated in laser processing is prevented from adhering to the upper surface of the wafer. Moreover, due to generation of fine bubbles (cavitation) generated in the water due to the irradiation with the laser beam, there is an effect that the debris that hinders promotion of the laser processing is scraped out from a processing groove. In addition, there is an effect that the flexural strength of individually divided device chips is improved.

SUMMARY OF THE INVENTION

However, in the case in which the layer of water is formed on the upper surface of the wafer and irradiation with the laser beam with a wavelength having absorbability with respect to the wafer is executed to process the wafer as described above, the cavitation scatters part of the laser beam, and thus there is a problem that a place other than a desired processing position (for example, planned dividing line) is irradiated with part of the laser beam and the quality of devices is lowered.

Thus, an object of the present invention is to provide a laser processing method in which devices formed on a front surface of a wafer are not damaged and the quality of individually divided devices is not lowered even when fine bubbles are generated in water and a laser beam with which irradiation is executed is scattered.

In accordance with an aspect of the present invention, there is provided a laser processing method including a scattered-light blocking film stacking step of stacking a scattered-light blocking film that blocks scattered light of a laser beam on an upper surface side of a wafer, a holding step of holding a lower surface side of the wafer by a chuck table, a laser processing step of forming a layer of water on the upper surface side of the wafer and irradiating a region to be processed in the wafer with the laser beam while moving the chuck table and a laser beam irradiation unit relatively, and a scattered-light blocking film removal step of removing the scattered-light blocking film from the wafer for which the laser processing step has ended.

Preferably, the scattered-light blocking film is stacked by evaporation or sputtering of at least any of Si, Ge, or Al in the scattered-light blocking film stacking step. In the case in which the scattered-light blocking film is stacked by evaporation or sputtering of at least any of Si, Ge, or Al in the scattered-light blocking film stacking step, preferably, the scattered-light blocking film is removed from the wafer by polishing in the scattered-light blocking film removal step.

Preferably, the scattered-light blocking film is stacked by coating with a resin or pressure bonding of the resin in the scattered-light blocking film stacking step. In the case in which the scattered-light blocking film is stacked by coating with a resin or pressure bonding of the resin in the scattered-light blocking film stacking step, preferably, the scattered-light blocking film is removed from the wafer by a solvent in the scattered-light blocking film removal step.

The upper surface side of the wafer may be coated with a resin film before the scattered-light blocking film is stacked by evaporation or sputtering in the scattered-light blocking film stacking step.

According to the present invention, in the case in which the layer of water is formed on the upper surface of the wafer and irradiation with the laser beam with a wavelength having absorbability with respect to the wafer is executed to process the wafer, even when fine bubbles (cavitation) generated in the layer of water scatter part of the laser beam, the occurrence of damage to devices is prevented by the scattered-light blocking film formed on the front surface of the wafer. Thus, the problem that the quality of the devices lowers is eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
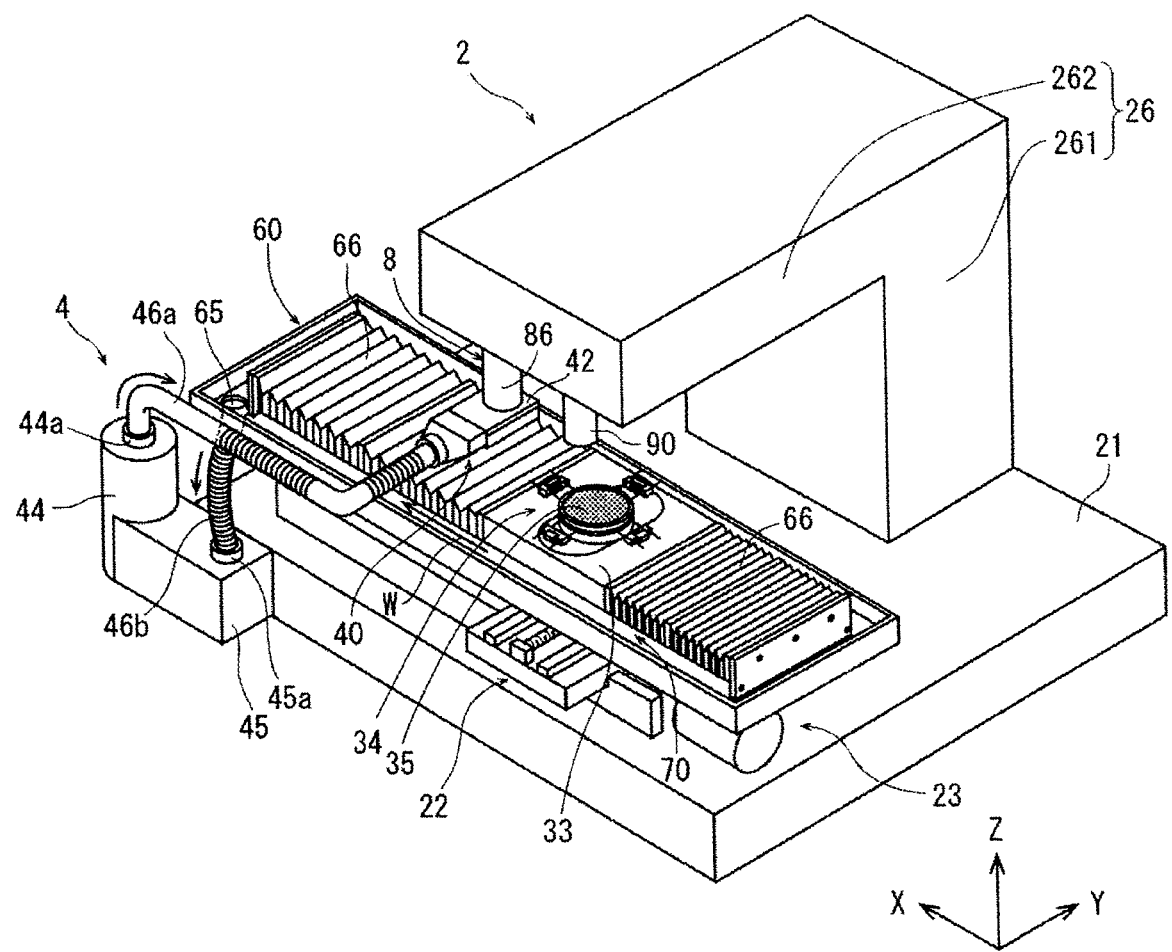
FIG. 1 is an overall perspective view of a laser processing apparatus.

A laser processing method of an embodiment of the present invention will be described in detail below with reference to the accompanying drawings. In FIG. 1, a perspective view of a laser processing apparatus 2 suitable for execution of the laser processing method of the present embodiment is illustrated. The laser processing apparatus 2 includes a liquid supply mechanism 4 that is disposed on a base 21 and supplies a liquid onto a water that is a plate-shaped workpiece, a laser beam irradiation unit 8 that executes irradiation with a laser beam with a wavelength having absorbability with respect to the workpiece, and a holding unit 22 that holds the workpiece. The laser processing apparatus 2 further includes a movement mechanism 23 that moves the laser beam irradiation unit 8 and the holding unit 22 relatively and a frame body 26 composed of a vertical wall part 261 disposed upright in a Z-direction indicated by an arrow Z on a lateral side of the movement mechanism 23 on the base 21 and a horizontal wall part 262 that extends in a horizontal direction from an upper end part of the vertical wall part 261.

Inside the horizontal wall part 262 of the frame body 26, an optical system (not illustrated) including a laser oscillator and so forth that configure the laser beam irradiation unit 8 is housed. On a lower surface side of a tip part of the horizontal wall part 262, a light collector 86 that configures part of the laser beam irradiation unit 8 is disposed. In addition, an alignment unit 90 is disposed at a position adjacent to the light collector 86 in a direction indicated by an arrow X in the diagram.

The alignment unit 90 is used for imaging the workpiece held by a chuck table 34 that configures the holding unit 22 and detecting a region for which laser processing is to be executed to execute position adjustment between the light collector 86 and a processing position of the workpiece. The alignment unit 90 is equipped with an appropriate imaging element (charge coupled device (CCD)) that images an upper surface of the workpiece. For example, the alignment unit 90 includes infrared irradiation means that executes irradiation with infrared, an optical system that captures the infrared with which irradiation is executed by the infrared irradiation means, and an imaging element (infrared CCD) that outputs an electrical signal corresponding to the infrared captured by the optical system. The above-described laser processing apparatus 2 is wholly covered and sealed by a housing or the like omitted for convenience of description and is configured in such a manner that fine particles, dust, and so forth do not enter the inside.

Figure 2:
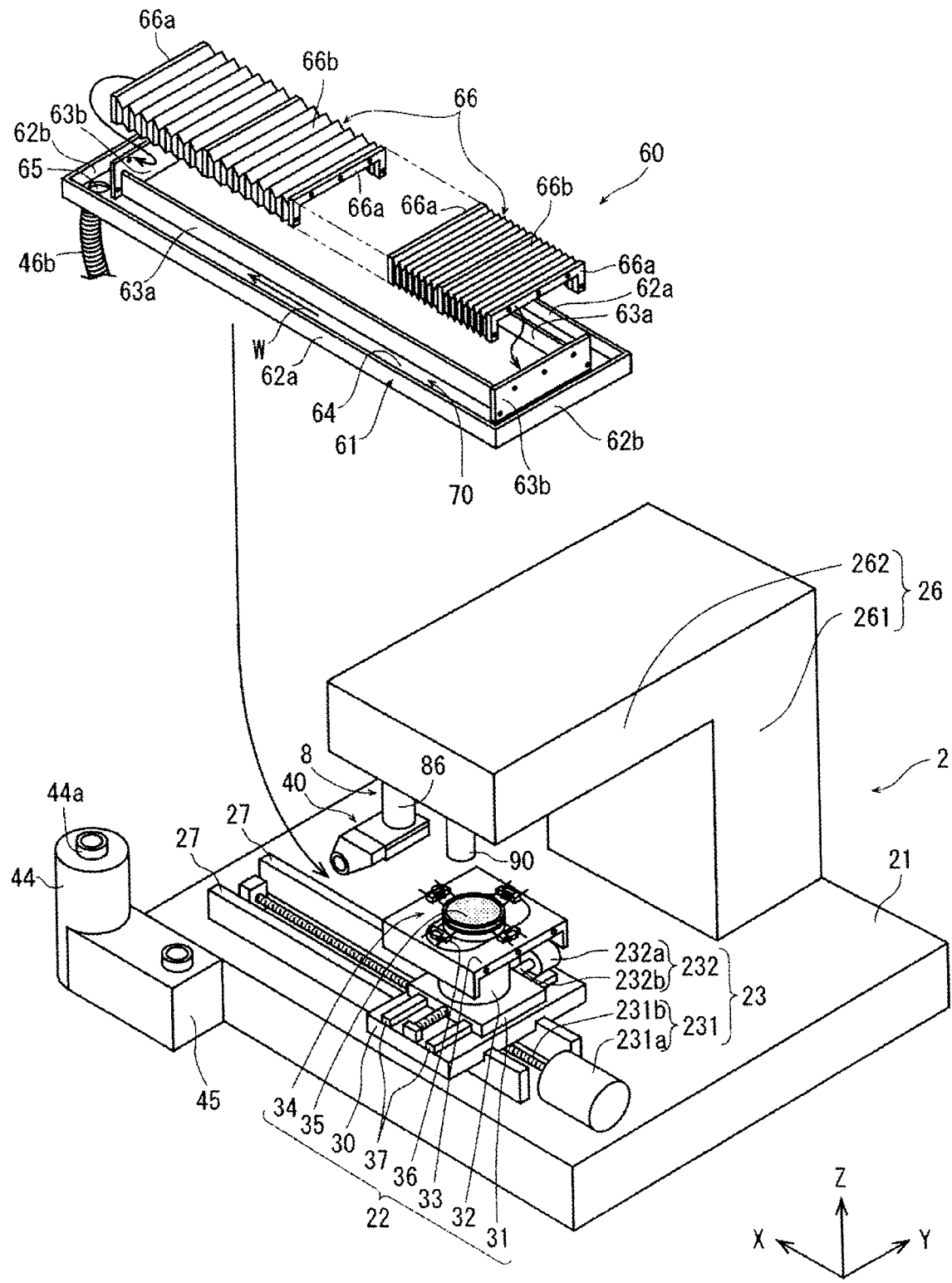
FIG. 2 is an exploded perspective view illustrating the laser processing apparatus that is illustrated in FIG. 1 and is partly disassembled.

The laser processing apparatus 2 according to the present embodiment will be described in more detail with reference to FIG. 2 in addition to FIG. 1. FIG. 2 is a perspective view illustrating a state in which, in the laser processing apparatus 2 described in FIG. 1, a liquid recovery pool 60 that configures part of the liquid supply mechanism 4 has been removed from the laser processing apparatus 2 and been partly disassembled.

As illustrated in FIG. 2, the holding unit 22 includes a rectangular X-direction movable plate 30 mounted over the base 21 movably in an X-direction indicated by the arrow X, a rectangular Y-direction movable plate 31 mounted over the X-direction movable plate 30 movably in a Y-direction that is indicated by an arrow Y and is orthogonal to the X-direction, a circular cylindrical support column 32 fixed to an upper surface of the Y-direction movable plate 31, and a rectangular cover plate 33 fixed to the upper end of the support column 32. The cover plate 33 has the chuck table 34 that passes through a long hole formed in the cover plate 33 and extends upward. The chuck table 34 is configured to hold the plate-shaped workpiece and be rotatable by rotational drive means that is not illustrated in the diagram. In the chuck table 34, a circular suction adhesion chuck 35 that is formed of a porous material having air permeability and extends substantially horizontally is disposed. The suction adhesion chuck 35 is connected to suction means that is not illustrated in the diagram by a flow path that passes through the support column 32, and four clamps 36 are disposed around the suction adhesion chuck 35 at intervals. A plane defined by the X-direction and the Y-direction that define an upper surface of the suction adhesion chuck 35 substantially forms a horizontal plane.

The movement mechanism 23 includes an X-direction movement mechanism 231 and a Y-direction movement mechanism 232. The X-direction movement mechanism 231 converts rotational motion of a motor 231a to linear motion through a ball screw 231b and transmits the linear motion to the X-direction movable plate 30 to cause the X-direction movable plate 30 to advance and retreat in the X-direction along guide rails 27 on the base 21. The Y-direction movement mechanism 232 converts rotational motion of a motor 232a to linear motion through a ball screw 232b and transmits the linear motion to the Y-direction movable plate 31 to cause the Y-direction movable plate 31 to advance and retreat in the Y-direction along guide rails 37 on the X-direction movable plate 30. Although diagrammatic representation is omitted, position detecting means is disposed for each of the chuck table 34, the X-direction movement mechanism 231, and the Y-direction movement mechanism 232, and a position in the X-direction, a position in the Y-direction, and a rotational position in a circumferential direction regarding the chuck table 34 are accurately detected. Based on the detected positions, the X-direction movement mechanism 231, the Y-direction movement mechanism 232, and the rotational drive means of the chuck table 34, which is not illustrated in the diagram, are driven. This allows the chuck table 34 to be accurately positioned at any position and angle. The above-described X-direction movement mechanism 231 is a processing feed mechanism that moves the holding unit 22 in a processing feed direction, and the Y-direction movement mechanism 232 is indexing feed means that moves the holding unit 22 in an indexing feed direction.

The liquid supply mechanism 4 will be described with reference to also FIGS. 3A and 3B in addition to FIG. 1 and FIG. 2. As illustrated in FIG. 1, the liquid supply mechanism 4 includes a liquid layer forming instrument 40 disposed as water layer forming means that forms a layer of water on the upper surface side of a workpiece, a liquid supply pump 44, a filtration filter 45, a liquid recovery pool 60, a pipe 46a that connects the liquid layer forming instrument 40 and the liquid supply pump 44, and a pipe 46b that connects the liquid recovery pool 60 and the filtration filter 45. It is preferable for the pipe 46a and the pipe 46b to be partly or wholly formed of a flexible hose.

Figure 3A:
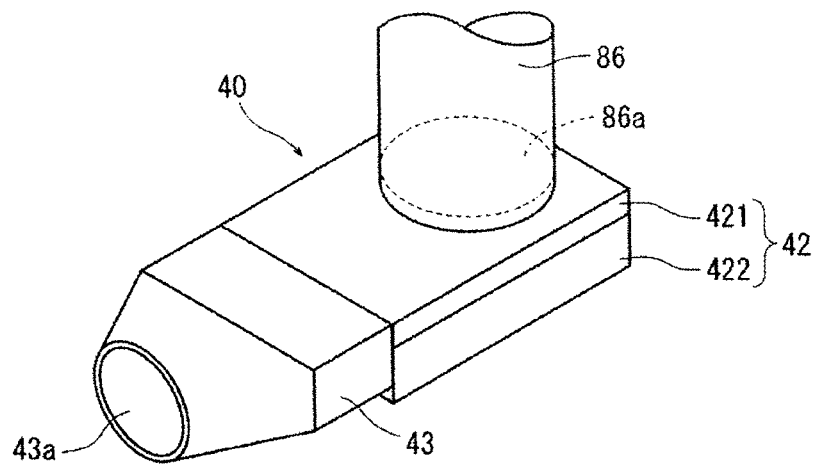
FIG. 3A is a perspective view of a liquid layer forming instrument mounted in the laser processing apparatus illustrated in FIG. 1.
Figure 3B:
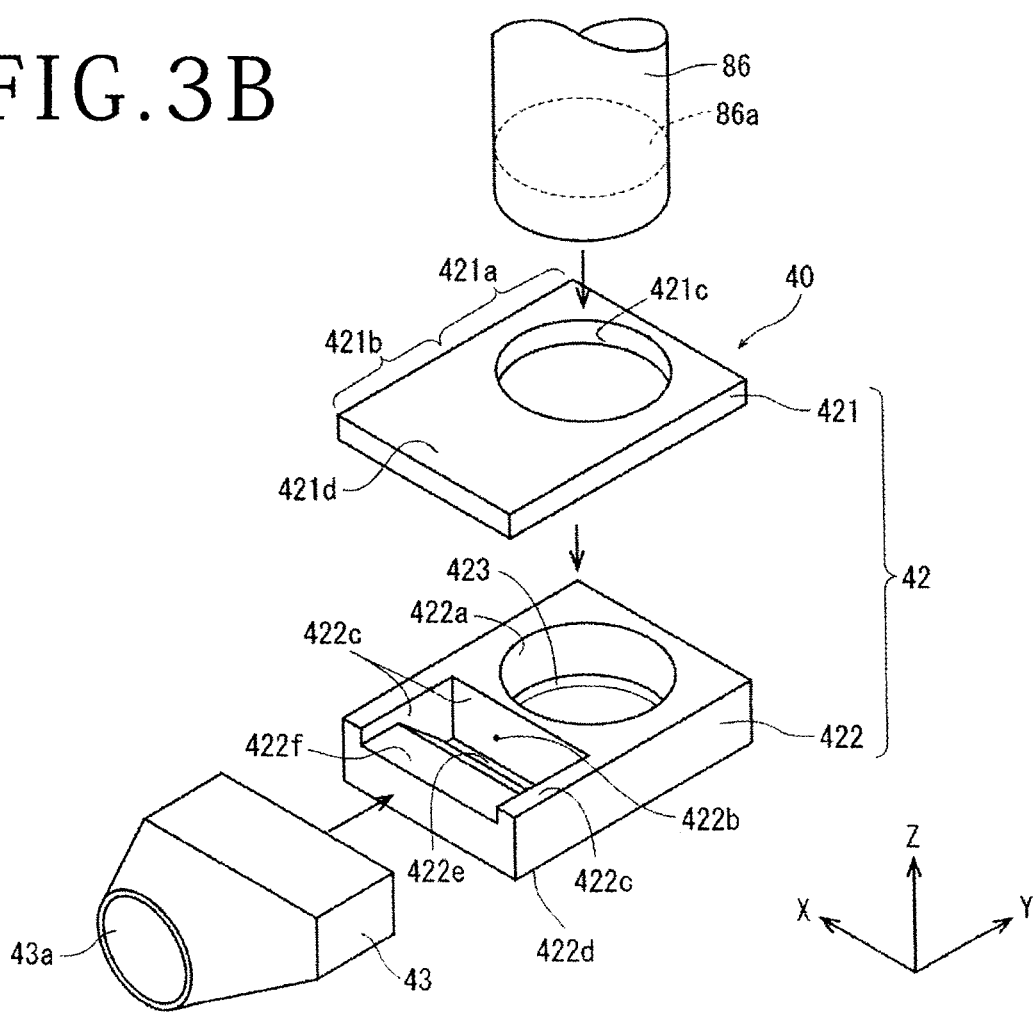
FIG. 3B is an exploded perspective view illustrating the liquid layer forming instrument disassembled.

As illustrated in FIG. 3A, the liquid layer forming instrument 40 is disposed at a lower end part of the light collector 86. As is understood from FIG. 3B that illustrates an exploded perspective view of the liquid layer forming instrument 40, the liquid layer forming instrument 40 is composed of a casing 42 and a liquid supply part 43 that supplies a liquid to the casing 42. The casing 42 forms a substantially rectangular shape in plan view and is composed of a casing upper member 421 and a casing lower member 422.

The casing upper member 421 is divided into two regions 421a and 421b in the Y-direction indicated by the arrow Y in the diagram, and a circular opening part 421c for insertion of the light collector 86 is formed in the region 421a on the far side in the diagram. In the region 421b on the near side, a plate-shaped part 421d is formed. In the casing lower member 422, in a region opposed to the opening part 421c of the casing upper member 421, a circular cylindrical opening part 422a that corresponds with the opening part 421c in disposing position and shape in plan view is formed. A transparent part 423 with a circular plate shape is disposed at a bottom part of the opening part 422a and closes the bottom part of the opening part 422a. The transparent part 423 has such nature as to permit passing of a laser beam LB to be described later through the transparent part 423, and is formed of a glass plate, for example.

In the casing lower member 422, a liquid flow path part 422b for ejecting a liquid from a bottom wall 422d of the casing 42 is formed in a region opposed to the plate-shaped part 421d of the casing upper member 421. The liquid flow path part 422b is a space formed by the plate-shaped part 421d of the casing upper member 421, sidewalls 422c, and the bottom wall 422d. A slit-shaped ejection port 422e that extends in the processing feed direction indicated by the arrow X in the diagram is formed in the bottom wall 422d of the liquid flow path part 422b, and a liquid supply port 422f for supplying the liquid to the liquid flow path part 422b is formed in the sidewall on the side to which the liquid supply part 43 is coupled. A lower surface of the above-described transparent part 423 is formed to be flush with the slit-shaped ejection port 422e extending in the processing feed direction, and the transparent part 423 forms part of the bottom wall 422d of the casing lower member 422.

The liquid supply part 43 includes a supply port 43a to which water W is supplied, a discharge port (not illustrated) formed at a position opposed to the liquid supply port 422f formed in the casing 42, and a communication path (not illustrated) that makes the supply port 43a and the discharge port communicate with each other. The liquid supply part 43 is assembled to the sidewall in which the liquid supply port 422f is opened in the casing 42 from the Y-direction, thereby forming the liquid layer forming instrument 40. The water W supplied in the present embodiment is purified water. However, the water W is not necessarily limited to purified water, and what is obtained by adding another liquid is also included as long as it is a liquid composed mainly of water.

The liquid layer forming instrument 40 has the above-described configuration, and the water W delivered from the liquid supply pump 44 illustrated in FIG. 1 passes through the supply port 43a of the liquid supply part 43 and is supplied to the liquid supply port 422f of the casing 42. Then, the water W flows in the liquid flow path part 422b of the casing 42 and is discharged to the outside from the ejection port 422e formed in the bottom wall 422d. For the liquid layer forming instrument 40, as illustrated in FIG. 1, the liquid supply part 43 and the casing 42 are attached to the lower end part of the light collector 86 in such a manner as to be along the Y-direction in the diagram. Due to this, the ejection port 422e formed in the bottom wall 422d of the casing 42 is positioned to extend along the X-direction, which is the processing feed direction.

Referring back to FIG. 1 and FIG. 2, the liquid recovery pool 60 will be described. As illustrated in FIG. 2, the liquid recovery pool 60 includes an outer frame 61 and two waterproof covers 66.

The outer frame 61 includes outside walls 62a that extend in the X-direction indicated by the arrow X in the diagram, outside walls 62b that extend in the Y-direction indicated by the arrow Y in the diagram, inside walls 63a and 63b disposed inside the outside walls 62a and 62b in parallel at predetermined intervals, and a bottom wall 64 that links lower ends of the outside walls 62a and 62b and the inside walls 63a and 63b. A rectangular liquid recovery path 70 having a longitudinal direction along the X-direction and a short direction along the Y-direction is formed by the outside walls 62a and 62b, the inside walls 63a and 63b, and the bottom wall 64. An opening that vertically penetrates is formed inside the inside walls 63a and 63b configuring the liquid recovery path 70. A minute inclination is set in the X-direction and the Y-direction for the bottom wall 64 configuring the liquid recovery path 70, and a liquid discharge hole 65 is disposed at a corner part that is the lowest position in the liquid recovery path 70 (corner part on the left side in the diagram). The pipe 46b is connected to the liquid discharge hole 65, and the liquid discharge hole 65 is connected to the filtration filter 45 through the pipe 46b (see also FIG. 1). It is preferable for the outer frame 61 to be wholly formed of a plate material made of stainless steel resistant to corrosion and rust.

The two waterproof covers 66 each include fixing metal fittings 66a with a gate shape and a bellows-shaped cover member 66b that is made of a resin and has both ends to which the fixing metal fittings 66a are fixed. The fixing metal fittings 66a are formed with such dimensions as to be capable of straddling the two inside walls 63a disposed opposed to each other in the Y-direction in the outer frame 61. One of the fixing metal fittings 66a of each of the two waterproof covers 66 is fixed to a corresponding one of the inside walls 63b disposed opposed to each other in the X-direction in the outer frame 61. The liquid recovery pool 60 configured as above is fixed over the base 21 of the laser processing apparatus 2 by a fixing tool that is not illustrated in the diagram. The cover plate 33 of the holding unit 22 is fixed in such a manner as to be sandwiched by the fixing metal fittings 66a of the two waterproof covers 66. End surfaces of the cover plate 33 in the X-direction form a gate shape same as the fixing metal fittings 66a and have such dimensions as to straddle the inside walls 63a of the outer frame 61 in the Y-direction similarly to the fixing metal fittings 66a. According to the above-described configuration, when the cover plate 33 is moved in the X-direction by the X-direction movement mechanism 231, the cover plate 33 moves along the inside walls 63a of the liquid recovery pool 60.

Referring back to FIG. 1, because the liquid supply mechanism 4 has the above-described configuration, the water W delivered from a delivery port 44a of the liquid supply pump 44 is supplied to the liquid layer forming instrument 40 via the pipe 46a. The water W supplied to the liquid layer forming instrument 40 is ejected downward from the ejection port 422e formed in the bottom wall 422d of the casing 42 of the liquid layer forming instrument 40.

The water W ejected from the liquid layer forming instrument 40 flows on the cover plate 33 or the waterproof covers 66 and flows down to the liquid recovery pool 60. The water W that has flown down to the liquid recovery pool 60 flows in the liquid recovery path 70 and is collected to the liquid discharge hole 65 made at the lowest position in the liquid recovery path 70. The water W collected to the liquid discharge hole 65 is led to the filtration filter 45 via the pipe 46b, and molten object (debris), dust, dirt, and so forth generated due to laser processing are removed in the filtration filter 45. Then, the water W is returned to the liquid supply pump 44. In this manner, the water W delivered by the liquid supply pump 44 circulates in the liquid supply mechanism 4.

The above-described laser processing apparatus 2 substantially has the configuration described above. A laser processing method of the present embodiment executed with use of the laser processing apparatus 2 will be described below.

Figure 4:
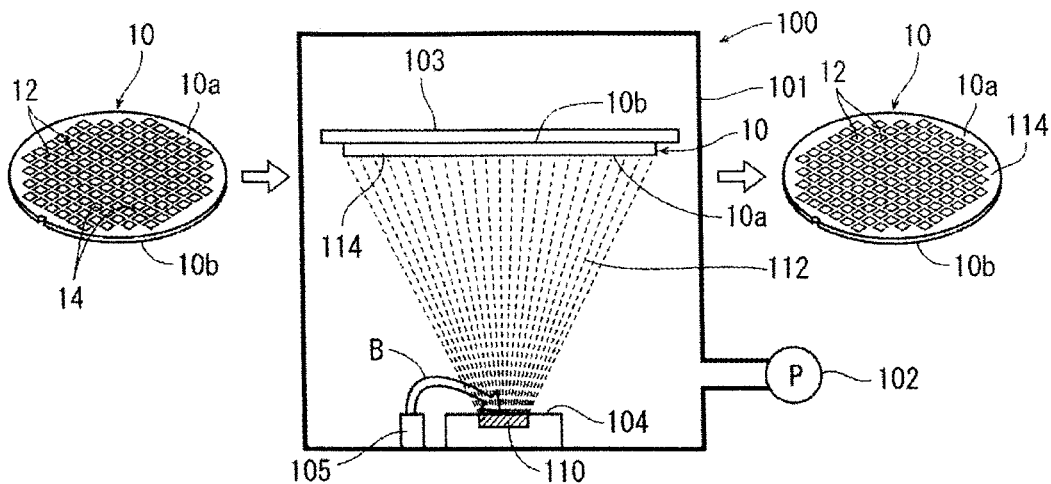
FIG. 4 is a conceptual diagram illustrating an execution form of a scattered-light blocking film stacking step.

A workpiece processed in the laser processing method of the present embodiment is, for example, a silicon wafer 10 on which plural devices 12 are formed on a front surface 10a in such a manner as to be marked out by plural planned dividing lines 14 that intersect, as illustrated on the left side in FIG. 4. After the wafer 10 has been prepared, the wafer 10 is conveyed to an evaporation apparatus 100 illustrated at the center in the diagram in order to execute a scattered-light blocking film stacking step of stacking a scattered-light blocking film 114 that blocks scattered light of a laser beam LB with which irradiation is executed in a laser processing step to be described later, on an upper surface (front surface 10a) of the wafer 10. The evaporation apparatus 100 includes a vacuum chamber 101 inside which a vacuum is created by a vacuum pump 102. In the vacuum chamber 101, a support plate 103 that supports the wafer 10 on a lower surface thereof and includes heating means (not illustrated) and a crucible 104 that is placed below the support plate 103 and in which a film deposition material 110 is heated by an electron beam B emitted from an electron beam generating device 105 are provided. The film deposition material 110 in the present embodiment is silicon (Si), for example.

The wafer 10 conveyed to the evaporation apparatus 100 is held in such a manner that the side of the front surface 10a is oriented downward and the side of a back surface 10b is stuck to the lower surface of the support plate 103. After the vacuum pump 102 is actuated to discharge air in the vacuum chamber 101 and the pressure in the vacuum chamber 101 is reduced to a vacuum, the electron beam generating device 105 is actuated, and the film deposition material 110 is irradiated with the electron beam B and is heated to release Si molecules 112 through evaporation. The Si molecules 112 are stacked on the front surface 10a of the wafer 10 to form the scattered-light blocking film 114. The electron beam B emitted from the electron beam generating device 105 is radiated to the film deposition material 110 with the trajectory thereof controlled by a coil for scanning about which diagrammatic representation is omitted. The thickness of the scattered-light blocking film 114 formed on the front surface 10a of the wafer 10 is, for example, 0.1 to 0.5 μm. This thickness of the scattered-light blocking film 114 is a thickness with which the devices 12 of the wafer 10 are not damaged even when the laser beam LB to be described later is scattered due to water bubbles and is incident as scattered light, and ablation processing is executed and a desired processing groove is formed when the laser beam LB travels straight to be applied to the wafer 10.

After the above-described scattered-light blocking film 114 is formed on the front surface 10a of the wafer 10, the wafer 10 is unloaded from the evaporation apparatus 100 (see the right side in the diagram), so that the scattered-light blocking film stacking step is completed. The scattered-light blocking film 114 formed by the evaporation apparatus 100 is not limited to the above-described Si and may be germanium (Ge) or aluminum (Al). Furthermore, the specific measure to form the scattered-light blocking film 114 on the front surface 10a of the wafer 10 is not limited to the above-described evaporation, and it is also possible to form the scattered-light blocking film 114 by well-known sputtering.

Figure 5:
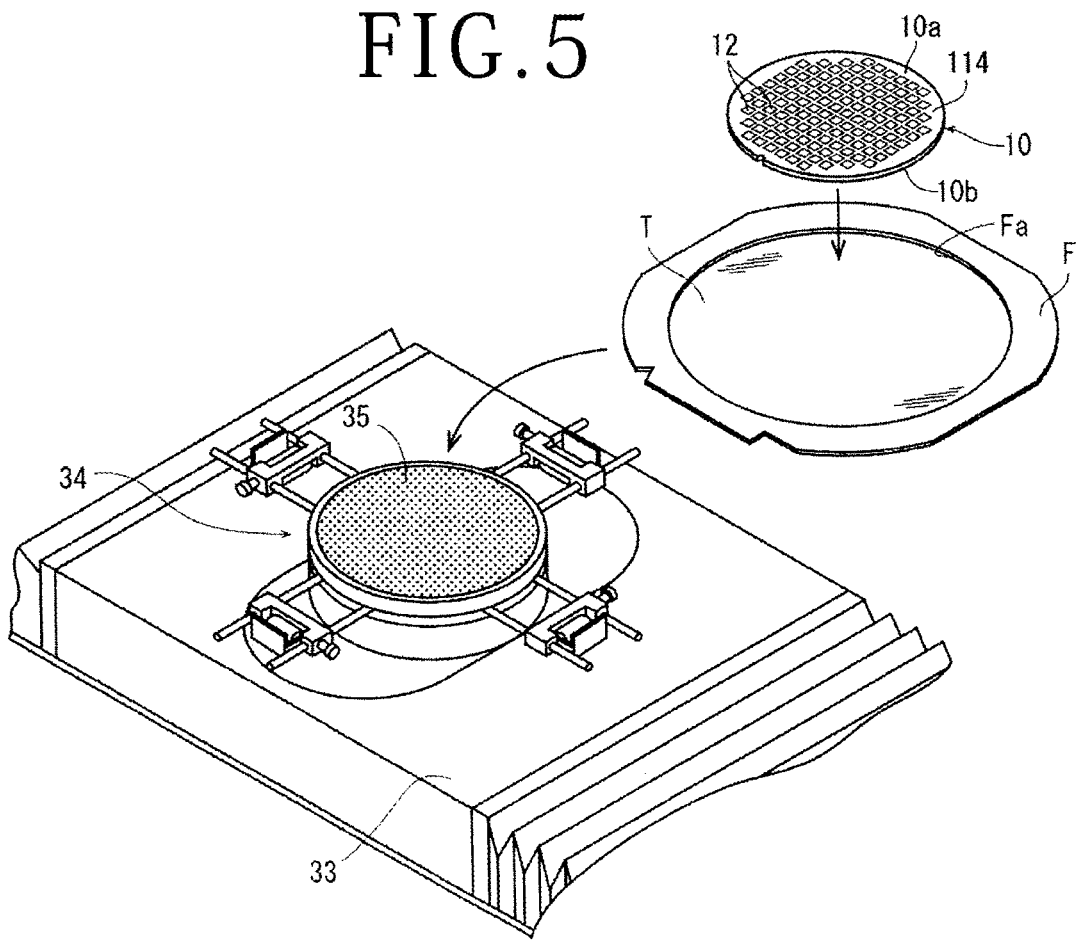
FIG. 5 is a perspective view illustrating an execution form of a holding step.

Subsequently, the wafer 10 for which the scattered-light blocking film stacking step has been executed and that has been unloaded from the evaporation apparatus 100 is conveyed to the above-described laser processing apparatus 2. Then, as illustrated in FIG. 5, the side of the lower surface (back surface 10b) of the wafer 10 is placed on the chuck table 34 configuring the holding unit 22 of the laser processing apparatus 2 described based on FIG. 2, and suction means about which diagrammatic representation is omitted is actuated to hold the wafer 10 (holding step). In the present embodiment, when the holding step is executed, an annular frame F having an opening Fa in which the wafer 10 can be housed is prepared, and the frame F and the wafer 10 are integrated through a protective tape T. When being placed on the chuck table 34, the wafer 10 is sucked and held with the frame F fixed by the clamps 36.

After the above-described holding step is executed, a laser processing step is executed. In this laser processing step, a layer of water is formed on the upper surface of the wafer 10, i.e., on the side of the front surface 10a, by the liquid layer forming instrument 40 configuring the water layer forming means. In addition, while the holding unit 22 that holds the wafer 10 and the laser beam irradiation unit 8 are relatively moved, the region that is to be processed in the wafer 10, i.e., the planned dividing lines 14, is irradiated with the laser beam LB. This laser processing step will be described more specifically with reference to FIG. 1, FIGS. 6A and 6B, and FIG. 7.

Figure 6A:
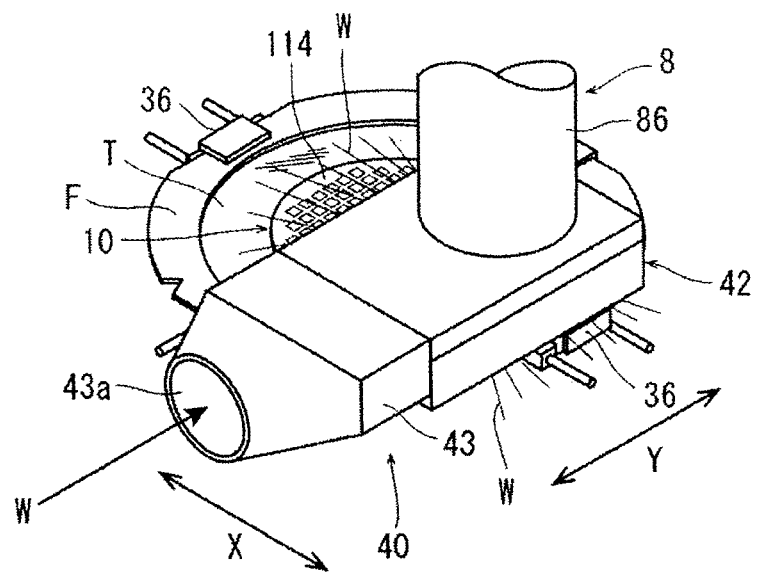
FIG. 6A is a perspective view illustrating an execution form of a laser processing step.
Figure 6B:
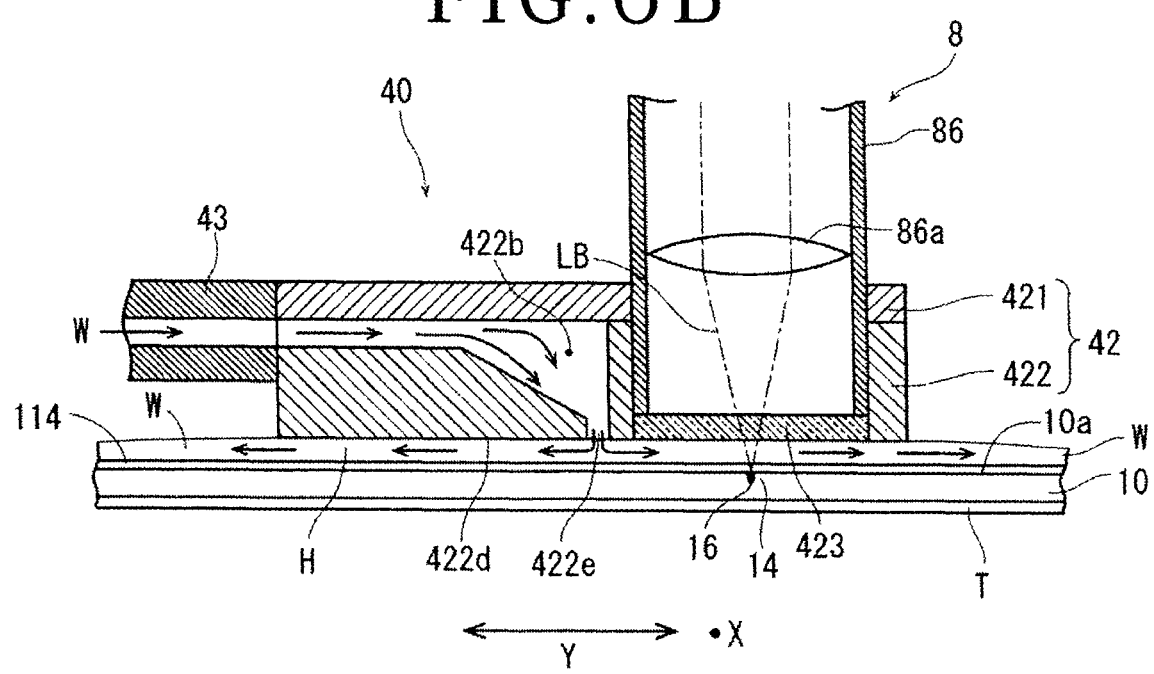
FIG. 6B is a partially enlarged sectional view of the execution form illustrated in FIG. 6A.

After the wafer 10 is held on the suction adhesion chuck 35 of the chuck table 34, the chuck table 34 is moved in the X-direction and the Y-direction as appropriate by the movement mechanism 23 illustrated in FIG. 1, and the wafer 10 on the chuck table 34 is positioned directly under the alignment unit 90. After the wafer 10 is positioned directly under the alignment unit 90, the front surface 10a of the wafer 10 is imaged by the alignment unit 90. Subsequently, based on an image of the wafer 10 imaged by the alignment unit 90, the position of a planned dividing line 14 that is to be processed in the wafer 10 is detected. By moving the chuck table 34 on the basis of this detected position information, the light collector 86 is positioned above a position at which processing is to be started on the wafer 10 as illustrated in FIG. 6A. Subsequently, the light collector 86 is moved by focal point position adjusting means that is not illustrated in the diagram and, as illustrated in FIG. 6B, the focal point is positioned to the front surface 10a of the wafer 10 in the planned dividing line 14 that is the laser processing start position of the wafer 10. As described later, a layer of the water W supplied by the liquid supply mechanism 4 is formed between a lower surface of the liquid layer forming instrument 40 and the scattered-light blocking film 114 formed on the front surface 10a of the wafer 10. Thus, a refractive index of the layer of the water W is considered when the focal point is positioned.

After the position adjustment between the light collector 86 and the wafer 10 is executed, the liquid supply mechanism 4 is replenished with a necessary and sufficient amount of water W, and the liquid supply pump 44 is actuated. As is understood from FIG. 6B, when the focal point is positioned to a position in the front surface 10a of the wafer 10, a gap H is formed between the lower surfaces of the bottom wall 422d of the casing 42 configuring the liquid layer forming instrument 40 and the transparent part 423 and the scattered-light blocking film 114 formed on the front surface 10a of the wafer 10 (height of the gap H is approximately 0.5 to 2.0 mm, for example).

The water W is supplied from the above-described liquid supply pump 44 to the liquid supply part 43 of the liquid supply mechanism 4. The supplied water W passes through the inside of the casing 42 of the liquid layer forming instrument 40 and is ejected downward from the ejection port 422e formed in the bottom wall 422d. As illustrated in FIG. 6B, the water W ejected from the ejection port 422e forms a layer of the water W while filling the gap H formed between the bottom wall 422d of the casing 42 and the wafer 10 and between the transparent part 423 and the wafer 10. The water W that has flown in the gap H flows out to the outside of the chuck table 34 and flows in the liquid recovery path 70 of the liquid recovery pool 60 described based on FIGS. 1 and 2 to be collected to the liquid discharge hole 65 made at the lowest position in the liquid recovery path 70. The water W collected to the liquid discharge hole 65 is led to the filtration filter 45 via the pipe 46b and is purified in the filtration filter 45 to be returned to the liquid supply pump 44 and circulate in the liquid supply mechanism 4.

Through the elapse of a predetermined period of time (about several minutes) after the start of actuation of the liquid supply mechanism 4, the gap H between the bottom wall 422d of the casing 42 and the transparent part 423 and the wafer 10 is filled with the water W. Due to this, the layer of the water W that does not contain cavitation in a state in which laser processing is not being executed is formed, which makes a state in which the water W stably circulates in the liquid supply mechanism 4.

As illustrated in FIG. 6B, in the state in which the water W is stably circulating in the liquid supply mechanism 4, the X-direction movement mechanism 231 configuring the above-described movement mechanism 23 is actuated while the laser beam irradiation unit 8 is actuated. As illustrated in FIG. 6A, processing feed of the holding unit 22 and the laser beam irradiation unit 8 is thereby executed to cause movement at a predetermined movement speed in the X-direction (direction perpendicular to the plane of paper in which FIG. 6B is illustrated), and irradiation with the laser beam LB is executed along the planned dividing line 14 to form a laser processing groove 16.

Processing conditions of the laser processing executed by the above-described laser processing apparatus 2 are set as follows, for example.

Figure 7:
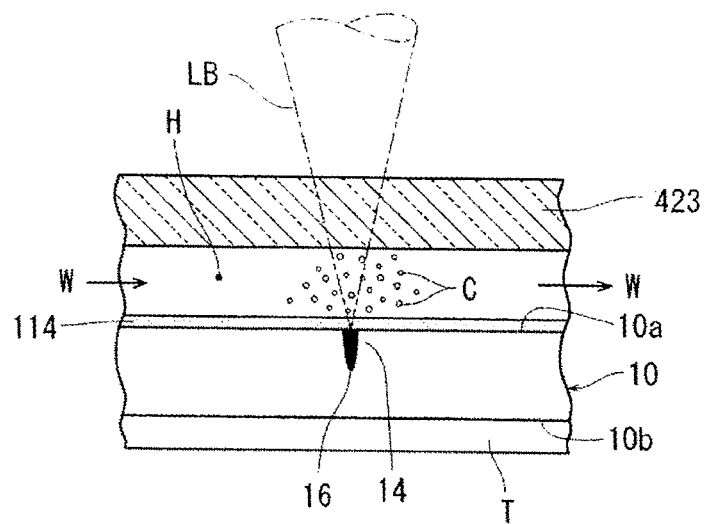
FIG. 7 is a partially enlarged sectional view illustrating the execution form of the laser processing step illustrated in FIG. 6B in a further enlarged manner.

Wavelength: 355 nm
Average output power: 6 W
Repetition frequency: 30 MHz
Pulse width: 200 fs
Processing feed rate: 100 mm/s Here, when the side of the front surface 10a of the wafer 10 is irradiated with the laser beam LB, as illustrated in FIG. 7, cavitation C occurs in the water W that fills the gap H due to the irradiation of the wafer 10 with the laser beam LB. Furthermore, part of the laser beam LB emitted from the light collector 86 impinges on the cavitation C and is scattered to be applied to a position that deviates from the planned dividing line 14. However, in the present embodiment, the scattered-light blocking film 114 that blocks the scattered light and prevents damage to the wafer 10 is formed on the front surface 10a of the wafer 10, and therefore, the occurrence of damage to the devices 12 is prevented. As described above, the scattered-light blocking film 114 is set to a thickness with which damage to the devices 12 is prevented even when irradiation with scattered light arising from impingement of part of the laser beam LB on the cavitation C is caused whereas ablation is caused and the desired laser processing groove 16 is generated along the planned dividing line 14 when the laser beam LB does not impinge on the cavitation C and travels straight as it is to be applied to the wafer 10. Thus, an obstacle is not imposed on the laser processing step.

By actuating the above-described laser beam irradiation unit 8 and actuating the X-direction movement mechanism 231, the Y-direction movement mechanism 232, and the rotational drive means that rotates the chuck table 34, the laser processing grooves 16 are formed along all planned dividing lines 14 formed in the front surface 10a of the wafer 10, so that the laser processing step is completed.

Figure 8:
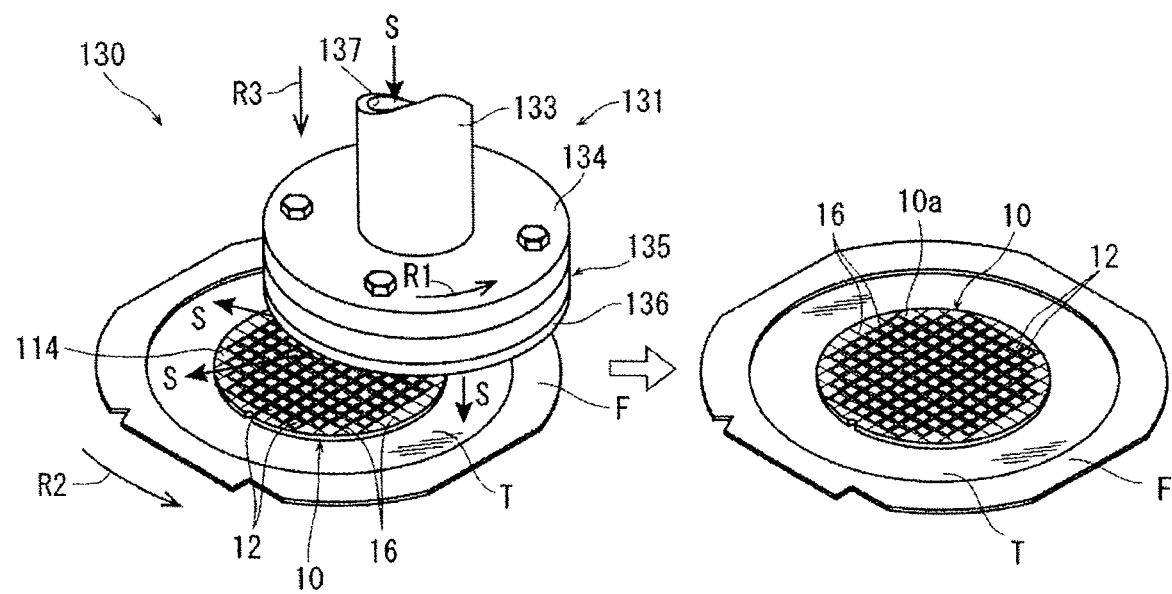
FIG. 8 is a perspective view illustrating an execution form of a scattered-light blocking film removal step.

Subsequently, the wafer 10 for which the laser processing step has been executed is unloaded from the laser processing apparatus 2 and is conveyed to a polishing apparatus 130 illustrated in FIG. 8 (only part thereof is illustrated). The polishing apparatus 130 of the present embodiment includes a holding unit (not illustrated) configured to hold the wafer 10 and be capable of being rotationally driven and a polishing unit 131 that polishes the upper surface of the wafer 10 held by the holding unit, and is configured to be capable of executing chemical mechanical polishing (CMP). The polishing unit 131 includes a rotating shaft 133 rotated in a direction indicated by an arrow R1 by rotational drive means about which diagrammatic representation is omitted, a mounter 134 formed at a lower end of the rotating shaft 133, and a polishing wheel 135 mounted on a lower surface of the mounter 134. A polishing pad 136 is disposed on a lower surface of the polishing wheel 135. Inside the rotating shaft 133, a communication path 137 for supplying slurry S that is supplied from a slurry supply unit about which diagrammatic representation is omitted and contains various chemical components, fine abrasive grains, and so forth is formed.

The wafer 10 is conveyed to the above-described polishing apparatus 130 and is held on the holding unit in such a manner that the side of the scattered-light blocking film 114 of the conveyed wafer 10 is oriented upward. Then, the wafer 10 is positioned directly under the polishing unit 131. Then, the polishing wheel 135 is rotated in the direction indicated by the arrow R1. In addition, the wafer 10 held by the holding unit is rotated in a direction indicated by an arrow R2. Subsequently, a polishing feed mechanism about which diagrammatic representation is omitted is actuated, and the polishing unit 131 is lowered in a direction indicated by an arrow R3 to cause the polishing pad 136 to abut against the upper surface at which the scattered-light blocking film 114 is formed in the wafer 10. At this time, the slurry supply unit is actuated to supply the slurry S for CMP suitable to remove the scattered-light blocking film 114 by polishing to a lower surface of the polishing pad 136 and the upper surface of the wafer 10 through the communication path 137 of the rotating shaft 133, and CMP is executed.

The slurry S is selected from, for example, ceria-based slurry, alumina-based slurry, and so forth according to the scattered-light blocking film 114 to be removed. By executing this CMP for a predetermined period of time, the scattered-light blocking film 114 is removed from the upper surface of the wafer 10 as illustrated on the right side in FIG. 8, so that the scattered-light blocking film removal step is completed. In the above-described embodiment, the example in which the upper surface of the wafer 10 is polished by CMP is presented. However, the present invention is not limited thereto and the scattered-light blocking film 114 may be removed by mechanical polishing with use of slurry that does not contain what is generally called a chemical solution.

According to the above-described embodiment, in the case in which a layer of the water W is formed on the upper surface of the wafer 10 and irradiation with the laser beam LB with a wavelength having absorbability with respect to the wafer 10 is executed to process the wafer 10, even when fine bubbles (cavitation C) generated in the layer of the water W scatter part of the laser beam LB to generate scattered light, the occurrence of damage to the devices 12 is prevented by the scattered-light blocking film 114 formed on the front surface 10a of the wafer 10. Thus, the problem that the quality of the devices 12 lowers is eliminated.

In the above-described embodiment, the example in which, in the scattered-light blocking film stacking step, any of Si, Ge, or Al is stacked on the front surface 10a of the wafer 10 by evaporation or sputtering to form the scattered-light blocking film 114 is presented. However, the present invention is not limited thereto. For example, as the scattered-light blocking film 114, an epoxy resin film may be stacked by coating or pressure bonding. In the case in which this resin is stacked as the scattered-light blocking film 114 and thereafter the scattered-light blocking film removal step is executed, the scattered-light blocking film 114 can be removed through using a solvent in which the resin is dissolved or peeling off the scattered-light blocking film 114.

Furthermore, in the scattered-light blocking film stacking step in the above-described embodiment, the example in which the scattered-light blocking film 114 is stacked directly on the front surface 10a of the wafer 10 is presented. However, the present invention is not limited thereto. A resin film may be formed on the upper surface (front surface 10a) of the wafer 10 before the scattered-light blocking film 114 is stacked by evaporation or sputtering in the scattered-light blocking film stacking step. This resin film may be the above-described resin film of epoxy or the like, or a water-soluble resin such as polyvinyl alcohol (PVA) may be employed. By forming the resin film on the front surface 10a of the wafer 10 before any of Si, Ge, or Al is stacked as the scattered-light blocking film 114, electrodes and so forth formed on the devices 12 can be protected when a film of Si, Ge, Al, or the like configuring the scattered-light blocking film 114 is removed by polishing in the scattered-light blocking film removal step. In this case, after CMP is executed to remove the film of Si, Ge, Al, or the like stacked by evaporation or sputtering, the resin film formed on the front surface 10a of the wafer 10 is removed by using a solvent according to this resin film. In the case in which this resin film is formed with a water-soluble resin, water can be used as the solvent.

As the scattered-light blocking film 114, besides the above-described embodiment, a liquid resin in which powder of carbon, Si, or a metal is mixed may be caused to coat the wafer 10 by spin-coating. When the scattered-light blocking film 114 is formed through stacking the liquid resin in which the powder is mixed, irradiation of the devices 12 of the wafer 10 with scattered light is further suppressed due to the existence of the powder.

As the scattered-light blocking film 114, any of a gold foil, a silver foil, or a copper foil may be employed and be stuck to the front surface 10a of the wafer 10. Furthermore, it is also possible to employ a sheet-shaped substance of graphene (graphite, carbon nanotube, fullerene, or the like) as the scattered-light blocking film 114.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method comprising:
   a scattered-light blocking film stacking step of stacking a scattered-light blocking film that blocks scattered light of a laser beam on an upper surface side of a wafer, wherein the scattered-light blocking film is stacked by coating with a liquid resin in which powder of carbon, Si, or a metal is mixed, and wherein a thickness of the scattered-light blocking film is between 0.1 to 0.5 μm;
   a holding step of holding a lower surface side of the wafer by a chuck table;
   a laser processing step of forming a layer of water on the upper surface side of the wafer and irradiating a region to be processed in the wafer with the laser beam while moving the chuck table and a laser beam irradiation unit relatively, wherein the laser beam is transmitted through a transparent member of a laser beam irradiation unit which is flush with an ejection port which supplies the water; and
   a scattered-light blocking film removal step of removing the scattered-light blocking film from the wafer for which the laser processing step has ended.

2. The laser processing method according to claim 1, wherein
   the scattered-light blocking film is stacked by evaporation or sputtering of at least any of Si, Ge, or Al in the scattered-light blocking film stacking step.

3. The laser processing method according to claim 2, wherein
   the scattered-light blocking film is removed from the wafer by polishing in the scattered-light blocking film removal step.

4. The laser processing method according to claim 1, wherein
   the scattered-light blocking film is removed from the wafer by a solvent in the scattered-light blocking film removal step.

5. The laser processing method according to claim 2, wherein
   the upper surface side of the wafer is coated with a resin film before the scattered-light blocking film is stacked by evaporation or sputtering in the scattered-light blocking film stacking step.

6. The laser processing method according to claim 1, wherein the scattered-light blocking film is water insoluble.

7. A laser processing method comprising:
   a scattered-light blocking film stacking step of stacking a scattered-light blocking film that blocks scattered light of a laser beam on an upper surface side of a wafer, wherein the scattered-light blocking film is stacked by evaporation or sputtering of at least any of Si, Ge, or Al;
   a holding step of holding a lower surface side of the wafer by a chuck table;
   a laser processing step of forming a layer of water on the upper surface side of the wafer and irradiating a region to be processed in the wafer with the laser beam while moving the chuck table and a laser beam irradiation unit relatively; and a scattered-light blocking film removal step of removing the scattered-light blocking film from the wafer for which the laser processing step has ended, wherein the scattered-light blocking film is removed from the wafer by polishing.

8. A laser processing method comprising:

a scattered-light blocking film stacking step of stacking a scattered-light blocking film that blocks scattered light of a laser beam on an upper surface side of a wafer, wherein the scattered-light blocking film is stacked by evaporation or sputtering of at least any of Si, Ge, or Al;

a holding step of holding a lower surface side of the wafer by a chuck table;

a laser processing step of forming a layer of water on the upper surface side of the wafer and irradiating a region to be processed in the wafer with the laser beam while moving the chuck table and a laser beam irradiation unit relatively; and a scattered-light blocking film removal step of removing the scattered-light blocking film from the wafer for which the laser processing step has ended, wherein the upper surface side of the wafer is coated with a resin film before the scattered-light blocking film is stacked by evaporation or sputtering in the scattered-light blocking film stacking step.

9. The laser processing method according to claim 1, wherein the scattered-light blocking film is stacked by spin-coating with the liquid resin.

10. The laser processing method according to claim 1, wherein the powder consists of Si or a metal.

11. The laser processing method according to claim 1, wherein the powder consists of Si.

12. The laser processing method according to claim 1, wherein the powder consists of a metal.

* * * * *